United States Patent [19]

Jenson

[11] Patent Number: 4,754,431
[45] Date of Patent: Jun. 28, 1988

[54] VIALESS SHORTING BARS FOR MAGNETORESISTIVE DEVICES

[75] Inventor: Mark L. Jenson, Princeton, Minn.
[73] Assignee: Honeywell Inc., Minneapolis, Minn.
[21] Appl. No.: 8,211
[22] Filed: Jan. 28, 1987
[51] Int. Cl.⁴ .............................................. G11C 11/15
[52] U.S. Cl. ..................................... 365/158; 365/173
[58] Field of Search .................. 365/158, 173; 360/113

[56] References Cited

U.S. PATENT DOCUMENTS

| 3,015,807 | 10/1957 | Pohm et al. | |
|---|---|---|---|
| 3,125,743 | 3/1958 | Pohm et al. | |
| 3,160,863 | 12/1964 | Partovi et al. | 365/158 |
| 3,375,503 | 9/1963 | Bertelsen | |
| 3,452,334 | 12/1964 | Voegeli | |
| 3,466,632 | 12/1966 | Wang | |
| 3,484,756 | 5/1966 | Voegeli | |
| 3,524,173 | 5/1967 | Wolf | |
| 3,525,023 | 8/1967 | Pollack | |
| 3,587,069 | 11/1969 | Goto | |
| 3,623,038 | 12/1969 | Franklin et al. | |
| 3,701,931 | 10/1972 | Revitz et al. | 428/641 |
| 3,701,983 | 10/1972 | Franklin et al. | 365/173 |
| 3,798,623 | 3/1974 | Kaske et al. | 365/173 |
| 3,864,751 | 2/1975 | Beaulieu et al. | 360/113 |
| 3,908,194 | 9/1975 | Ramankin | 360/113 |
| 3,996,575 | 12/1976 | Battarel | |
| 4,024,489 | 5/1977 | Bajorek et al. | 324/252 |
| 4,079,360 | 3/1978 | Ookubo et al. | |
| 4,097,802 | 6/1978 | Mahopac | |
| 4,208,725 | 6/1980 | Paul et al. | |
| 4,356,523 | 10/1982 | Yeh | 365/158 |
| 4,470,873 | 9/1984 | Nakamura | 365/32 |
| 4,503,394 | 3/1985 | Kawakami et al. | 360/113 |
| 4,504,552 | 3/1985 | Kim | 428/662 |

FOREIGN PATENT DOCUMENTS

| 0033399 | 3/1978 | Japan | 365/8 |
|---|---|---|---|
| 0123183 | 9/1980 | Japan | 365/8 |
| 0763964 | 9/1980 | U.S.S.R. | 365/8 |

OTHER PUBLICATIONS

J. M. Daughton et al., IBM Technical Disclosure Bulletin, vol. 8, No. 11, Apr. 1966, pp. 1613–1614.
J. Berchier et al., Magnetoresistive Switches of Small Permalloy Sandwich Structures, J. Appl. Phys. vol. 55, No. 2, Jan. 15, 1984, pp. 487–492.
Ooyen et al, Magnetoresistance in Laminated Fife Films, J. Appl. Phys. 53(3), Mar. 1982–pp. 2596–2598.
Ahn et al, Fabrication of Contiguous-Disk Magnetic Bubble Devices, IEEE Transactions on Magnetics, vol. MAG-15, No. 1, Jan. 1980.

Primary Examiner—James W. Moffitt
Attorney, Agent, or Firm—William T. Udseth

[57] ABSTRACT

A magnetic solid state device, such as a magnetoresistive memory cell, includes first and second layers of magnetoresistive material. The first and second layers are separated by a third layer which prevents exchange coupling between the magnetic dipoles of the first and second layers. The first, second and third layers are formed as a strip. A fourth layer of a resistive material, such as nitrogen doped tantalum, overlies the first layer. The fourth layer includes spaced, raised portions over which electrically conductive material, such as TiW, may be formed on top of the raised portions.

9 Claims, 3 Drawing Sheets

VIALESS SHORTING BARS FOR MAGNETORESISTIVE DEVICES

Reference is hereby made to an earlier filed copending application entitled "Resistive Overlayer for Magnetic Films" having Ser. No. 939,315 by J. A. Schuetz.

BACKGROUND OF THE INVENTION

1. Field of the Invention

This invention relates to magnetic memory cells having a nonmagnetic, resistive layer which overlies a three layer magnetic "sandwich" structure comprised of two magnetoresistive layers separated by an exchange coupling barrier layer, and wherein a conductive layer overlies the resistive layer at the junction of two of the magnetic cells.

2. Related Art

Certain magnetic memories utilize thin films of ferromagnetic, magnetoresistive materials as key elements.

Ferromagnetic materials are materials possessing permanent magnetic dipoles which exhibit a high degree of alignment at room temperature. The net magnetic moment $\overline{M}$ (or magnetization) of a ferromagnetic material is a measure of the alignment of the dipole moments in the material.

In forming ferromagnetic thin films, the orientation of $\overline{M}$ be selected by exposing a ferromagnetic material to a unidirectional external magnetic field during deposition or annealing. The resulting uniaxial anisotropic magnetic film has what is referred to as an easy magnetic axis (aligned with the direction of the externally applied magnetic field), and a hard magnetic axis which is perpendicular to the easy axis.

Further, the magnetic thin film is magneto-resistive. That is, the electrical resistance of the film depends upon the orientation of the easy axis relative to the direction of current flow. The maximum resistance occurs when the magnetization vector and the current direction are parallel, and the minimum resistance occurs when they are perpendicular.

In magnetic memories, data storage lines are formed from the above described magnetoresistive thin films. Data is stored in binary fashion by utilizing a magnetic thin film deposited, as distinct cells, along a sense or bit line. The easy axis is often oriented along the bit line. If the magnetization of a cell is in a first direction along the bit line, the bit is defined as a 1; if the magnetization is in a second direction opposite the first direction, the bit is defined as a 0.

A conductive current strap, or word line, is typically disposed orthogonal to and overlying the bit line. The word line is electrically isolated from the bit line.

The data condition of a cell is sensed or read by passing a sense current through the bit line and a word current through the word line. The sense current is typically very small, e.g. only a few milliamps. The magnetic field associated with the sense current interacts with and rotates the magnetization of the thin film within the plane of the thin film to an oblique position with respect to the easy axis. The rotated magnetization vector will be in a different position for a 0 than for a 1. The magnetic field associated with the word current will either increase or decrease the angle of rotation of the magnetization with respect to the easy axis, depending on the logic state of the bit being sensed.

A sense amplifier, connected across the bit line and responsive to the sense current, will detect a different electrical signal for a 0 than for a 1.

A write operation is similar to a read operation except that the magnitude of the sense and word currents are increased so that together the magnetic fields associated with the sense and word currents are sufficient to flip the rotated magnetization vector from one logic state to the other.

Some magnetic memories form the easy axis perpendicular (or transverse) to the longitudinal axis of the bit line. Read and write operations in that case are similar to those of the longitudinal cell.

The magnetization of the magnetic cells disposed along a bit line must be independent of the magnetization of adjacent cells. This is achieved by cutting the magnetic material at bit cell junctions or reducing the width of the bit line at cell junctions to an extent sufficient to decouple the magnetization of adjacent cells.

The sense current in the bit line must flow through cell junctions without undue constraint, so conductive paths or "shorting bars" of a good electrical conductor are formed between the cells and, in the case of the narrowed bit line, over the narrowed junction portion.

The process for manufacturing the magneto-resistive bit lines involves depositing one or more layers of material over an underlying layer or surface, and etching the deposited material to a desired configuration. Several problems with the memory result from the manufacturing process.

First, in forming the shorting bars, typically a via is cut through an $SiO_2$ layer to expose the bit cell junction. Once exposed to deposition chamber atmosphere, a thin oxide or other high resistance layer will form on the upper surface of the bit cell junction (or the memory cell will be exposed to other contaminants). Although this oxide and/or contaminant is sputtered off prior to shorting bar deposition, a less than perfect interface is formed. If the shorting bar is at the end of a bit cell line, it will often be configured as an electrical contact to a bit line sense amplifier. The interface resistance will substantially increase the contact resistance of this electrical contact, further reducing the already small signal current.

The cell junction at the end of a bit cell line could be specially processed, but this will add complicated processing steps and increase production costs.

Second, each via that is cut in the oxide adds another potential process error site to the magnetic memory. Thus minimizing the number of vias needed to produce the bit cell lines is advantageous.

Third, a thin resistive layer may be formed over the magnetic thin film to protect the thin film during processing. One material useful as the resistive layer, nitrogen doped tantalum ($TaN_x$), has an etch rate similar to $SiO_2$. If the etch of the $SiO_2$ is not carefully controlled, the resistive layer may be cut into deeply or even cut through. A further etch barrier to protect the magnetic thin film at sites where multiple etches will occur, such as bit cell junctions, is highly desirable.

Finally, if the shorting bars can be made coincident with the magnetic elements, the minimum "pitch" (i.e. the center to center spacing of the magnetic elements) can be decreased because the spacing requirements of via and metal are no longer a consideration.

SUMMARY OF THE INVENTION

The present invention is a magnetic, solid state device and the process for manufacturing the same. The device includes first and second layers of a ferromagnetic, magnetoresistive material, a third layer interposed between the first and second layers which prevents exchange coupling therebetween, a fourth layer of a resistive material overlying the first layer, and an electrically conductive material overlying separated portions of the fourth layer.

The device is particularly useful as a bit cell in a magnetoresistive memory.

The resistive material is preferably nitrogen doped tantalum, $TaN_x$. The four layers will be configured as a bit cell line in the magnetoresistive memory, with the resistive material having raised portions above the bit cell junctions. The electrically conductive material will be formed on the top of the raised portions of the resistive layer.

The above bit cell structure results from the in situ deposition of the electrical conductor over the bit cell layers, prior to etching of the bit cell lines. The result is a bit cell line free from many of the problems attendant other techniques for manufacturing the bit cell lines.

DESCRIPTION OF THE PREFERRED EMBODIMENT

Figure 1:
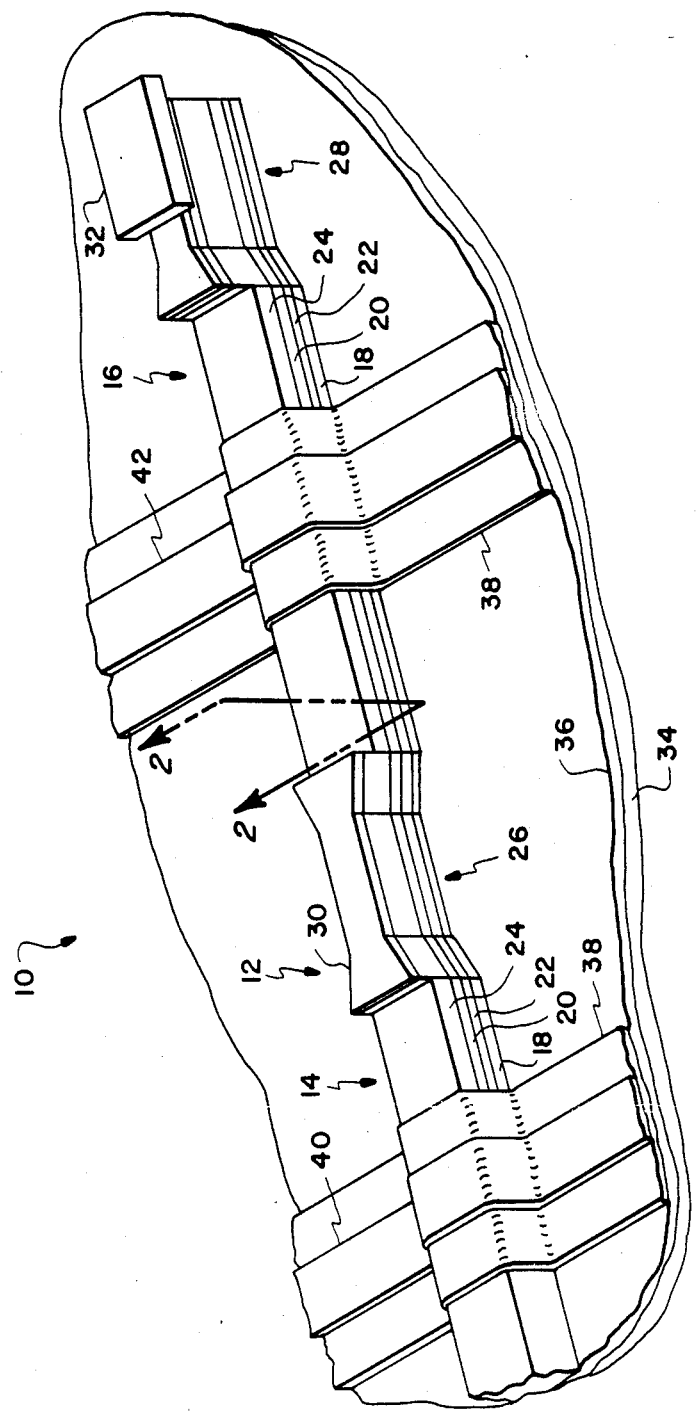
FIG. 1 is a perspective view of a portion of a magnetoresistive memory cell configured in accordance with the present invention.

FIG. 1 includes a portion of a magneto-resistive memory 10. Part of bit cell line 12 is shown, including part of bit cell 14 and all of bit cell 16. Bit cells 14 and 16 are comprised of first and second ferromagnetic, magnetoresistive layers 18 and 20, separated by a magnetic exchange coupling barrier layer 22. Layer 22 will prevent the magnetic domains in layer 18 from coupling to the magnetic domains of layer 20. Generally layer 22 will be of a nonmagnetic material. The magnetization vectors of layers 18 and 20 are antiparallel. Layers 18, 20 and 22 form a "sandwich" structure which results in good "flux closure", i.e. the magnetic field lines due to the magnetization of layers 18 and 20 are primarily confined to a closed path within the strucure. Flux closure reduces demagnetizing effects due to the presence of free magnetic poles at the edges of the ferromagnetic films and due to other nearby fields, and is important for the proper functioning of magnetic memories with densely packed cells.

Layer 24 overlies the sandwich structure. It is comprised of a resistive material which will not short out the electrical properties of layer 18 and serves as an etch stop to protect layer 18 during processing. A suitable material for layer 24 is nitrogen doped tantalum, $TaN_x$, where x is, preferably, selected so that Ta is 65 to 85 percent, by atomic concentration, of the $TaN_x$. By way of further example (and depending on the particular dimensions and application) the amount of N in the TaN may vary between 2% and 50%, by atomic concentration. In certain, unusual cases, the percent of N may even lie outside this range. Generally, for thinner layers 24, the percentage of N can vary more widely than for thicker layers 24. Other suitable materials for layer 24 are a mixture or compound of a metal and either nitrogen oxygen, where the mixture or compound will not diffuse into layer 18 during processing.

More generally, layer 24 is a material whose dimensions and resistivity are such that less than half of electrical current flowing through the bit cell (or device) will flow solely within layer 24, and layer 24 will not diffuse into layer 20 during processing. Preferably, only a small percent of the signal current will flow solely within layer 24.

Layer 24 is described in further detail in copending patent application Ser. No. 939,315 by J. A. Schuetz, filed Dec. 8, 1986 and entitled "Resistive Overlayer for Magnetic Films", the same being incorporated herein by reference.

Suitable materials for layers 18 and 20 are permalloy (e.g. a mixture of 65% Ni, 15% Fe and 20% CO) and $TaN_x$ for layers 22 and 24. Note that x can be a different value for each of layers 22 and 24. Typically each of layers 18, 20, 22 and 24 are on the order of one hundred to several hundred angstroms thick. A specific useful example would have a thickness of 150A for layers 18 and 20, 50A for layer 20, and 500A for layer 24.

At junctions 26 and 28 between bit cells, bit line 12 is narrowed (sometimes it is severed). Layer 24 is thicker over junctions 26 and 28 than over the bit cells. This is due to the process by which the cells are manufactured (see below).

Further, an electrical conductor 30 (such as TiW) is deposited over the thicker or raised portions of layer 24. If the junction is to serve as an electrical contact 32 to other components, such as a sense amplifier, a second metal (such as AlCu/TiW) overlays layer 30 (see junction 28).

Figure 2:
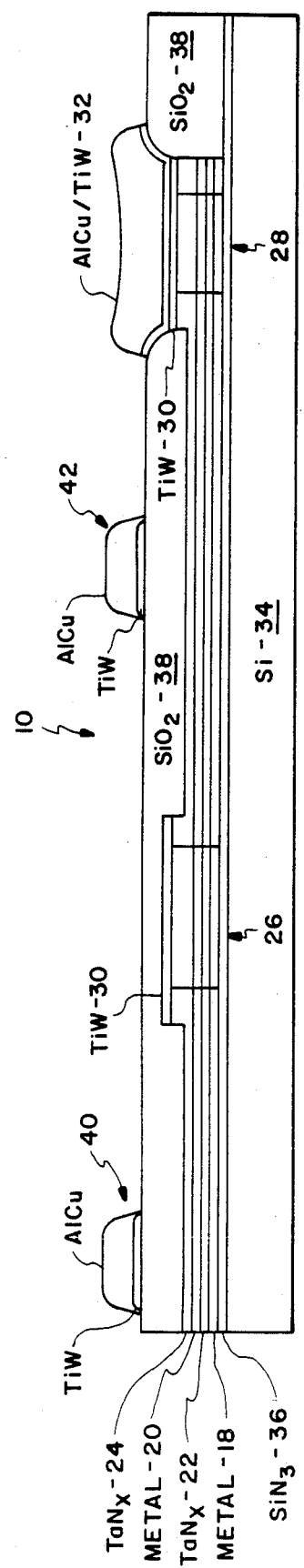
FIG. 2 is a cross section of FIG. 1 along line 2—2.

Bit cell line 12 will be formed in a substrate 34 (Si or GaAs) which typically has a covering layer 36 (such as $SiN_3$ for Si substrates). An insulating layer 38 (e.g. $SiO_2$) covers all of structure 10 except for electrical contacts 32 at the ends of the bit lines fromed from the second metal. Layer 38 is shown in cutaway as two strips in FIG. 1 for clarity. FIG. 2 shows the complete coverage of layer 38 in a sectional view. The memories' conductive word lines 40 and 42 lay transverse to and at the center of each bit cell. Word lines 40 and 42 are formed from the second metal.

With layer 38 covering all but contacts such as contact 32, one can see that shorting bars such as metal 30 over junction 26 can be formed without cutting a via in layer 38 which would expose layer 24 at the junction site. Thus no oxide or other high resistance layer will form on the upper surface of layer 24 during device processing, nor will the memory cell be exposed to contaminants.

Further, the number of vias cut is greatly reduced, typically being limited to only the contact sites at the end of the bit lines. Without a second metal over intermediate bit cell junctions, the width of the bit cell line is reduced and cells can be packed more closely.

If layer 38 is $SiO_2$ and layer 24 is $TaN_x$, metal 30 will have a much slower etch rate than either layer 38 or 24, and will provide an extra etch barrier over the bit cell junction sites. Thus when (as described further below) the bit cell lines are first etched and the vias subsequently etched, the electrical contact sites at the vias will be protected.

Figure 3:
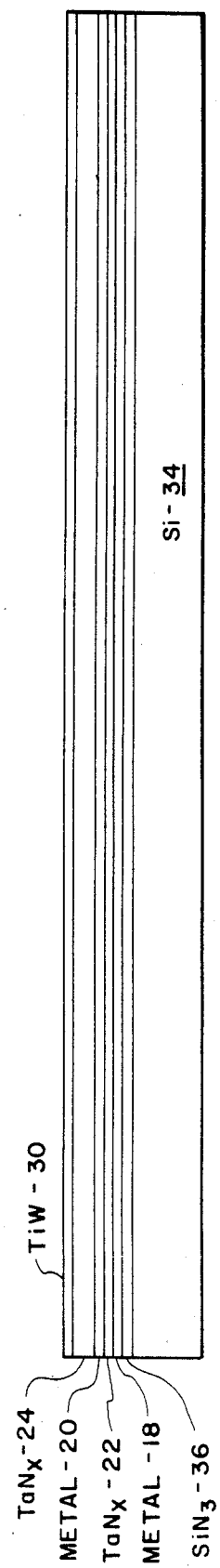
FIG. 3 is a cross section of an intermediate product of the process wich produces the device of FIG. 2.
Figure 4:
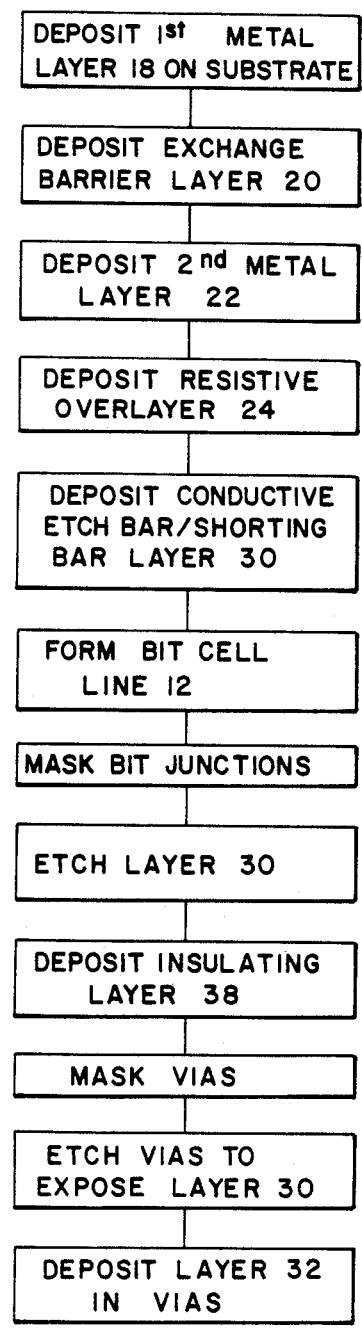
FIG. 4 is a flow chart of the process of the present invention.

FIG. 3 shows an intermediate product of the process which produces the device of FIG. 2. In FIG. 3 layers 18, 20, 22, 24 and 30 have been deposited or formed over the entire surface of structure 10.

Typically, bit cell line 12 is then ion milled. A shorting bar mask will be used to mask the bit cell junctions. A first etch (wet or dry) removes layer 30 from the unmasked portion of structure 10. For most dry etches, this first etch will cut into layer 24 resulting in raised portions of layer 24 being formed under the mask (i.e. at the junction sites). If the first etch is wet, (e.g. hot $H_2O_2/H_2O$) only layer 30 will be removed, resulting in pads of TiW at the junction sites.

Whether the first etch is wet or dry, the surface profile topography of the upper surface of layer 24 (shown in FIG. 2) will be substantially flat. That is, the maximum variation surface profile height will be less than 100Å, and often only a few angstroms. In contrast, when vias are first cut in an insulating layer (such as layer 38), and a second metal deposited at the via sites to form the shorting bars, the surface profile topography of the upper surface of layer 24 will not be flat—varying in height more than 100Å and typically varying in height several thousand angstroms.

After etching, the photoresist is stripped, layer 38 is deposited over all of structure 10 and the vias masked. A second etch forms the vias and exposes metal 30 at the selected locations.

Second metal, such as AlCu/TiW, is deposited, masked and etched to complete FIG. 2. Another passivation layer (not shown) typically covers all of device 10.

The present invention has been specifically described with regard to a magnetoresistive memory, but it may be used advantageously as an etch barrier and to protect a layer from a processing atmosphere in other solid state devices.

What is claimed is:

1. A magnetic, solid state device, comprising:
    a first layer of a ferromagnetic, magneto-resistive material;
    a second layer of a ferromagnetic, magneto-resistive material;
    a third layer interposed between, and in contact with, said first and said second layers, wherein said third layer prevents exchange coupling between said first and said second layers, and wherein said first, second and third layers are formed, at least in part, as a strip; and
    a fourth layer comprised of tantalum and nitrogen, said fourth layer overlying and being in contact with at least a part of said first layer, said fourth layer having a raised portion.

2. The device of claim 1, further including:
    an electrically conductive material overlying and in contact with said raised portion.

3. The device of claim 1 wherein said fourth layer further includes a plurality of said raised portions spaced along said strip.

4. A magnetic, solid state device, comprising:
    a first layer of a ferromagnetic, magneto-resistive material;
    a second layer of ferromagnetic, magneto-resistive material;
    a third layer interposed between, and in contact with, said first and said second layers, wherein said third layer prevents exchange coupling between said first and said second layers, and wherein said first, second and third layers are formed, at least in part, as a strip;
    a fourth layer comprised of nitrogen doped tantalum, $TaN_x$, said fourth layer overlying and being in contact with at least a part of said first layer, said fourth layer having a raised portion; and
    an electrically conductive material overlying and in contact with said raised portion.

5. The device of claim 1 wherein said fourth layer further includes a plurality of said raised portions spaced along said strip.

6. A magnetic, solid state device, comprising:
    a first layer of a ferromagnetic, magnetoresistive material;
    a second layer of a ferromagnetic, magnetoresistive material;
    a third layer interposed between, and in contact with, said first and said second layers, wherein said third layer prevents exchange coupling between said first and said second layers, and wherein said first, second and third layers are formed, at least in part, as a strip;
    a fourth layer comprised of tantalum and nitrogen, said fourth layer overlying and being in contact with at least a part of said first layer, said fourth layer having substantially flat upper surface opposite said first layer; and
    an electrically conductive material overlying and in contact with said upper surface at a plurality of sites spaced along said strip.

7. A magnetic, solid state device, wherein electrical current can flow through said device from a first to second location on said device, said device comprising:
    a first layer of a ferromagnetic, magnetoresistive material;
    a second layer of a ferromagnetic, magnetoresistive material;
    a third layer interposed between, and in contact with, said first and second layers, wherein said third layer prevents exchange coupling between said first and second layers, and wherein said first, second and third layers are formed, at least in part, as a strip; and
    a fourth layer of a resistive material, said fourth layer overlying and being in contact with said first layer, said first and second locations being on a surface of said fourth layer opposite said first layer, said resistive material dimensions and resistivity being such that less than half of the current flowing through said device from said first to said second locations will flow solely within said fourth layer, wherein said resistive material will not diffuse into said first layer, and wherein said fourth layer has a raised portion.

8. The device of claim 7 further including:
    an electrically conductive material overlying and in contact with said raised portion.

9. A magnetic, solid state device, wherein electrical current can flow through said device from a first to second location on said device, said device comprising:
    a first layer of a ferromagnetic, magnetoresistive material;
    a second layer of a ferromagnetic, magnetoresistive material;
    a third layer interposed between, and in contact with, said first and second layers, wherein said third layer prevents exchange coupling between said first and second layers, and wherein said first, second and third layers are formed, at least in part, as a strip; and a fourth layer of a resistive material, said fourth layer overlying and being in contact with said first layer, said first and second locations being on a surface of said fourth layer opposite said first layer, said resistive material dimensions and resistivity being such that less than half of the current flowing through said device from said first to said second locations will flow solely within said fourth layer, wherein said resistive material will not diffuse into said first layer, and wherein said fourth layer has a substantially flat upper surface opposite said first layer; and an electrically conductive material overlying and in contact with said upper surface at a plurality of sites spaced along said strip.

* * * * *